United States Patent
Ha et al.

(10) Patent No.: US 6,271,134 B1
(45) Date of Patent: Aug. 7, 2001

(54) APPARATUS FOR MANUFACTURING SEMICONDUCTOR DEVICE METHOD FOR FORMING HSG-POLYSILICON LAYER USING SAME AND METHOD FOR FORMING CAPACITOR HAVING ELECTRODE OF HSG-POLYSILICON LAYER

(75) Inventors: Dae-oh Ha; Yong-kyun Lim, both of Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/166,223

(22) Filed: Oct. 5, 1998

(30) Foreign Application Priority Data

Oct. 14, 1997 (KR) .................................................. 97-52639

(51) Int. Cl.[7] .......................... H01L 21/44; H01L 21/311
(52) U.S. Cl. ........................... 438/684; 438/669; 438/694
(58) Field of Search ..................................... 438/238, 669, 438/694, 684; 427/231, 237, 238, 239, 248.1, 578, 81, 419.1; 118/719, 715, 725, 730; 117/20, 88, 90, 103, 930

(56) References Cited

U.S. PATENT DOCUMENTS

| | | | |
|---|---|---|---|
| 4,962,726 | * 10/1990 | Matsushita et al. | 118/719 |
| 5,378,283 | * 1/1995 | Ushikawa | 118/719 |
| 5,387,265 | * 2/1995 | Kakizaki et al. | 29/25.01 |
| 5,462,397 | * 10/1995 | Iwabuchi | 414/222 |
| 5,863,602 | * 1/1999 | Watanabe et al. | 427/237 |
| 5,873,942 | * 2/1999 | Park et al. | 118/719 |
| 6,039,811 | * 3/2000 | Park et al. | 118/719 |

* cited by examiner

*Primary Examiner*—Trung Dang
*Assistant Examiner*—Brook Kebede
(74) *Attorney, Agent, or Firm*—Jones Volentine, PLLC (57) ABSTRACT

A semiconductor device manufacturing apparatus, an HSG-polysilicon layer forming method, and a method for forming a capacitor having the HSG-polysilicon layer as an electrode equilibrate the temperature of a processing chamber with a temperature close to that at which a semiconductor manufacturing process occurs. The semiconductor device manufacturing apparatus includes a wafer supporter for holding a wafer during the semiconductor manufacturing process. An elevator moves the wafer supporter vertically among a load/unload position, a standby position above the load/unload position, and a process position above the load/unload position. With this apparatus, processing uniformity is enhanced.

9 Claims, 7 Drawing Sheets

NUMBER OF BALD DEFECTS

TEMPERATURE (°C)

FIG. 7

GRADE

TEMPERATURE (°C)

APPARATUS FOR MANUFACTURING SEMICONDUCTOR DEVICE METHOD FOR FORMING HSG-POLYSILICON LAYER USING SAME AND METHOD FOR FORMING CAPACITOR HAVING ELECTRODE OF HSG-POLYSILICON LAYER

BACKGROUND OF THE INVENTION

1. Field of the Invention

The present invention relates to manufacturing microelectronics, and more particularly, to an apparatus for manufacturing a semiconductor device, a method for forming a polysilicon layer having hemispherical grains (HSG-polysilicon layer), and a method for forming a capacitor having the HSG-polysilicon layer as an electrode.

2. Description of the Related Art

To manufacture a highly reliable semiconductor device, it is important to set appropriate processing conditions. In particular, when the capacitance of a capacitor is increased by forming a hemispherical grain polysilicon (HSG-polysilicon) layer as a lower electrode to increase the surface area of the lower electrode, it is imperative to grow the HSG grains uniformly on an amorphous polysilicon layer.

To uniformly form HSG grains, a crystal growing process in which amorphous silicon accretes onto crystal silicon nuclei to form crystalline grains should be stable, e.g., temperature conditions in the process chamber should be steady. Also, the speed of silicon migration for forming the grains must be higher than the speed of amorphous silicon crystallization. Thus, to stabilize the crystal growing step and appropriately adjust the crystallizing speed, the amount of a source gas, the reaction time and temperature profile in the reaction chamber must be precisely controlled.

Unfortunately, the conventional technology for forming the HSG-polysilicon layer has not yet defined the optimal combination of the temperature profile in the reaction chamber, the flow rate of a silicon source gas, and the reaction (i.e., process) duration. One result is that the crystal growth step is easily disturbed by unsteady temperatures and non-optimal gas flow. Further, since the amorphous silicon crystallizing speed and the grain growing speed are not appropriately controlled, bald defects can be generated, in which HSG grains can grow abnormally as evidenced by higher reflectivity to light, and undesirable extraneous HSG grains may be formed on an insulating film beyond the region designed to form the lower electrode of a capacitor.

One problem leading to non-uniform HSG grains is caused by changes to the temperature profile in the processing chamber due to changes in the position of a wafer supporter. As the process proceeds, the wafer supporter moves from a position where loading and unloading occur and cooler ambient air is introduced into the chamber (a load/unload position), to a position where the crystal growing process occurs (a process position) and vice versa. In the HSG formation process, for example, the difference between temperatures at the load/unload position and the process position is over 70° C. Therefore, when the loaded wafer and wafer supporter move from the load/unload position to the process position to form the HSG-polysilicon layer, the wafer, and wafer supporter, and chamber temperatures continue to increase slowly with time until the temperature difference is minimized. When subjected to such a constantly varying temperature, the HSG-polysilicon layer forming process becomes non-uniform.

SUMMARY OF THE INVENTION

It is an object of the present invention to provide an apparatus and method for manufacturing a semiconductor device suitable for forming an HSG-polysilicon layer with increased stability during the process and fewer defects in the resulting layer.

It is still another object of the present invention to provide an optimal method for forming a capacitor with desired characteristics using the HSG-polysilicon layer as an electrode.

The semiconductor device manufacturing apparatus has a wafer supporter for holding a wafer during a semiconductor manufacturing process. An elevator moves the wafer supporter vertically among a load/unload position, a standby position above the load/unload position, and a process position above the load/unload position.

In another aspect of the invention, a method for manufacturing a semiconductor device includes maintaining a wafer supporter at a standby position in a processing chamber to equilibrate a temperature of the wafer supporter with a predetermined standby temperature of the processing chamber. Then the wafer supporter is lowered to a wafer load/unload position and a wafer is loaded onto the wafer supporter. Then the wafer supporter with the wafer loaded thereon is elevated to a process position where a process for manufacturing a semiconductor device is performed. The wafer supporter is lowered to the wafer load/unload position after the manufacturing process is completed, and the wafer is unloaded from the wafer supporter. Finally, the wafer supporter is a elevated to the standby position again.

In another aspect of the present invention, the process for manufacturing a semiconductor device includes supplying a silicon source gas at a flow rate within a flow rate range from about 7 standard cubic centimeters per minute (sccm) to about 23 sccm for a supply duration within a supply duration range from about 50 seconds to about 150 seconds to provide crystal silicon nuclei to an amorphous silicon layer disposed on a semiconductor substrate. Then the amorphous silicon layer with the crystal silicon nuclei is annealed for an anneal duration within an anneal duration range from about 100 seconds to about 400 seconds to convert the amorphous silicon layer into a hemispherical grain polysilicon (HSG-polysilicon) layer.

By using the semiconductor device manufacturing apparatus according to the present invention, the temperature profile of the chamber can be easily stabilized, thereby achieving more uniform processing with time. Also, by forming an HSG-polysilicon layer using processing variables set according to the present invention, an HSG polysilicon layer suitable for the lower electrode of a capacitor can be formed without bald defects.

BRIEF DESCRIPTION OF THE DRAWINGS

The present invention is described with reference to the drawings in which.

DESCRIPTION OF THE PREFERRED EMBODIMENTS

Here, the preferred embodiments of the present invention are described in detail with reference to accompanying drawings. However, the present invention is not limited to the following embodiments and can be implemented in various other forms. These embodiments are provided so that this disclosure will be thorough and complete, and will fully convey the invention to those skilled in the art. Throughout the drawings, various components of the apparatus and positional relationship therebetween are exaggerated for clarity. In the drawings, the same elements are designated by the same numbers.

Figure 1:
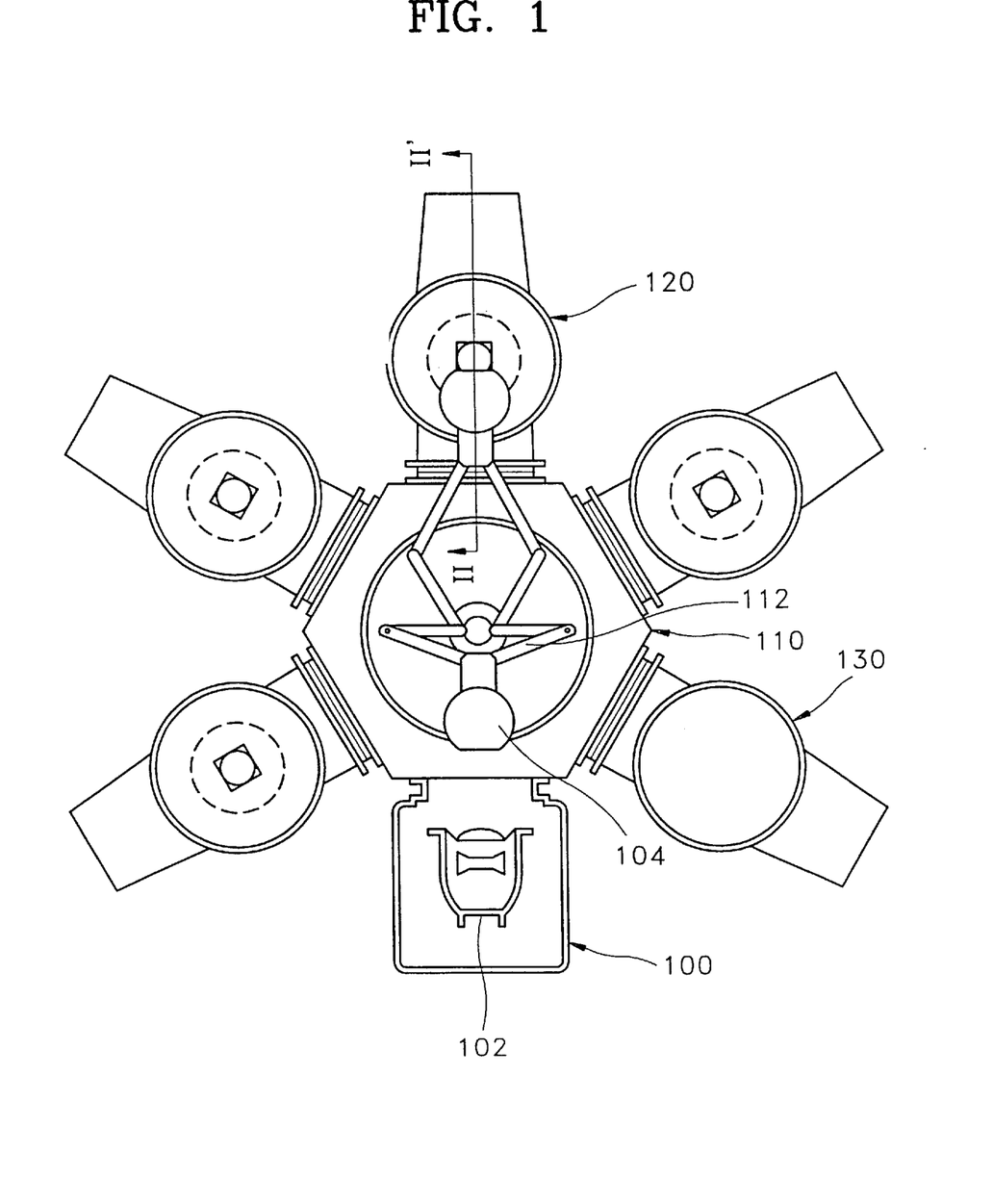
FIG. 1 is a plan view of a semiconductor device manufacturing apparatus according to a preferred embodiment of the present invention.

Referring to FIG. 1, the semiconductor device manufacturing apparatus according to the present invention comprises a process chamber 120 where the process for manufacturing the semiconductor device occurs. A cassette chamber 100, where a carrier 102 containing a wafer 104 is loaded, separates the carrier 102 from the ambient atmosphere of the manufacturing facility. A transfer chamber 110, having a robot arm 112, moves the wafer 104 into the processing chamber 120. A cooling chamber 130 is provided for cooling the wafer 104 after completing the process.

Figure 2:
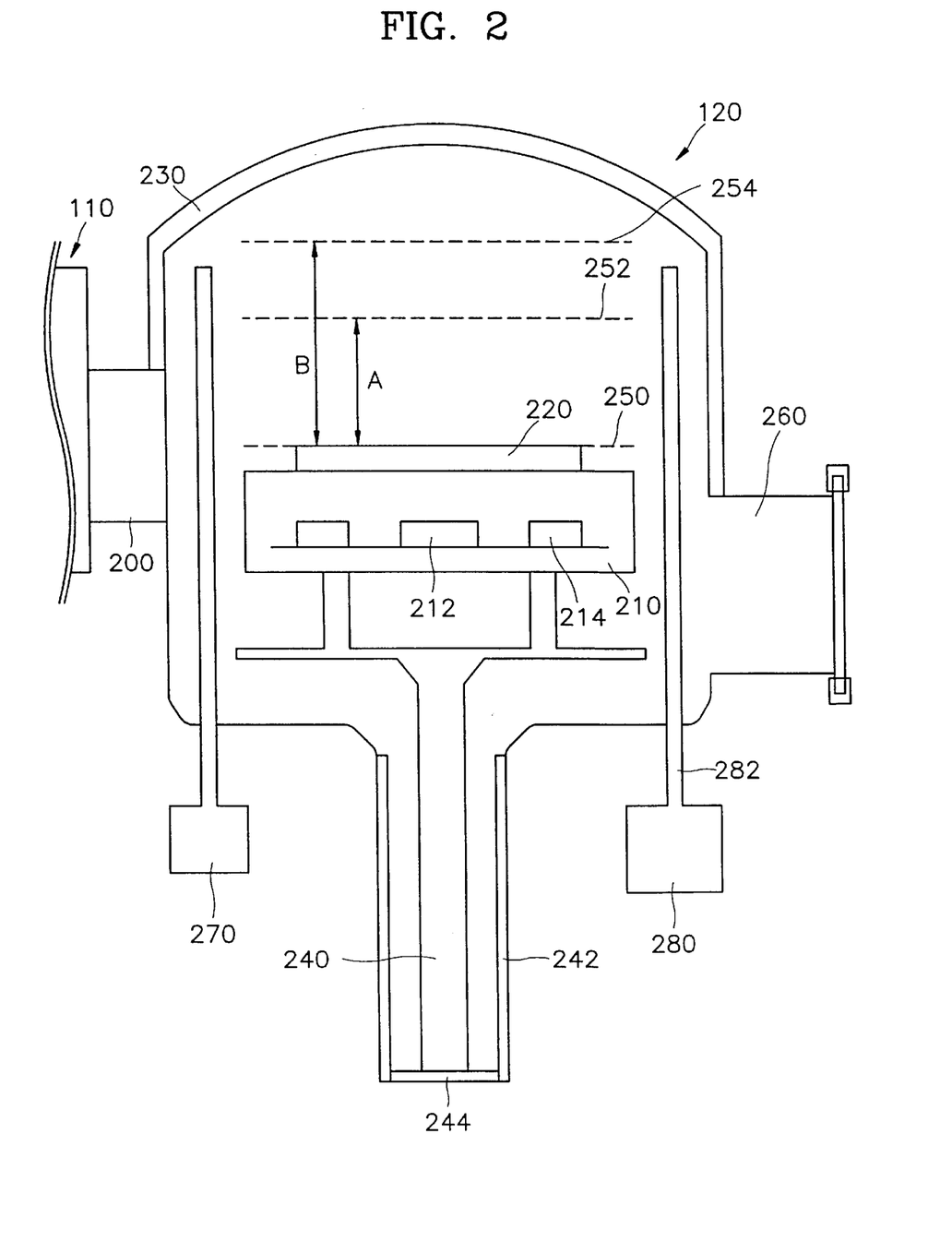
FIG. 2 is a sectional view taken along a line II–II' of FIG. 1.

FIG. 2 is section view of the processing chamber 120, taken along the line II–II' of FIG. 1. Referring to FIG. 2, the processing chamber 120 of the present invention has a wafer supporter 220 onto which a wafer to be processed is loaded. The wafer supporter can be set at three positions, at least. The positions include the load/unload position 250, a standby position 252, and a process position 254.

Typically, a gate 200 connects the transfer chamber 110 and the processing chamber 120, and is used as a path for loading and unloading the wafer. In a preferred embodiment of the present invention, a heating block 210 is also installed in the processing chamber 120 and the wafer supporter 220 is disposed on the heating block 210. On the outer surface of the processing chamber 120, an insulating jacket 230 is disposed for maintaining the temperature of the processing chamber 120 as constant as possible by reducing heat loss to the ambient temperatures of the manufacturing facility. In a preferred embodiment of the apparatus, the heating block 210 includes an inner heater 212 and an outer heater 214 to efficiently heat a wafer on the wafer supporter to a predetermined process temperature.

In the apparatus of the present invention, the wafer supporter 220 is moved vertically among the wafer load/unload position 250, the standby position 252 and the process position 254 by an elevator. In the preferred embodiment, the elevator includes a chuck 240 which is moved by moving a chuck prop 244 up and down along a sliding cylinder 242. The chuck 240 may be moved either manually or automatically.

The standby position 252 is chosen to make the process more uniform by minimizing the change in temperature profile of the processing chamber 120 caused by the temperature and vertical movement of the wafer supporter 220 and the wafer (not shown) loaded on the wafer supporter 220. The standby position is described by a standby ratio defined by the ratio between two distances A and B, respectively. The distance A is measured from the wafer load/unload position 250 to the standby position 252. The distance B is measured from the wafer load/unload position 250 to the process position 254. In the preferred embodiment of the apparatus, the standby ratio, i.e., A:B, is set to be greater than 0.63:1 and less than 0.8:1.

Typically, one side of the processing chamber 120 is connected to a vacuum system 260 having a pump (not shown) for maintaining the processing chamber 120 at a predetermined vacuum state. In the preferred embodiment, the processing chamber includes a chamber thermometer 270 for measuring the temperature of the processing chamber 120 near the process position 254, and both a reaction gas supplier 280 and a reaction gas supply tube 282 for injecting predetermined reaction gases into the processing chamber 120 at respective predetermined flow rates.

Hereinafter, the first method of the present invention for manufacturing the semiconductor device using the apparatus according to the present invention, is described with reference to FIG. 1 and FIG. 2.

At some time when the process is not occurring, the wafer supporter 220 is set at the standby position 252 and maintained in that position. This is done to let the temperature of the wafer supporter 220 equilibrate with the temperature at that position according to the desired temperature profile in the processing chamber 120. Preferably, the standby position temperature is close to the process position temperature. Then, immediately before a new wafer is loaded into the processing chamber 120 (for example, by the robot arm 112 from the cassette chamber 100 through the transfer chamber 110), the wafer supporter 220 descends from the standby position 252 to the wafer load/unload position 250 by the vertical motion of the elevator (for example, the chuck 240 on the movable chuck prop 244 attached to the sliding cylinder 242). When the wafer supporter 220 is stopped at the load/unload position 250, the wafer is loaded onto the wafer supporter 220, for example through the gate 200. Next, the wafer supporter 220 with the wafer loaded thereon rises on the elevator to the process position 254, passing the standby position 252 in the preferred embodiment. Then, the wafer supporter 220 is set at the process position 254, and then processing is performed. For example, the reaction gas is injected into the processing chamber 120 from the reaction gas supplier 280 through the reaction gas supply tube 282. In the preferred embodiment, the wafer temperature is heated to a predetermined constant process temperature by adjusting the current applied to the inner heater 212 and outer heater 214 in the heating block 210, and the stability of the temperature of the chamber near the process position is continuously checked by the chamber thermometer 270. After the process is completed, the wafer supporter 220 is moved downward by the elevator to the wafer load/unload position 250. There, the processed wafer is unloaded, for example, through the gate 200 using the robot arm 112.

In the preferred embodiment of this method of the present invention, using the apparatus of the present invention, several wafers, for example all the wafers from one wafer carrier cassette 102, are processed continuously in sequence before the wafer supporter 220 is returned to the standby position 252 by the elevator. Therefore next, in the case where the process is performed continuously on a plurality of wafers, a new wafer is loaded on the wafer supporter 220 and the steps of elevating to the process position, processing, descending to the load/unload position, and unloading are repeated until the last wafer to be processed is unloaded. Finally, after the last processed wafer is unloaded, the wafer supporter 220 is raised to the standby position 252 by the elevator, for example, the chuck 240. In the standby position, the temperature of the wafer supporter 220 is equilibrated to the temperature of the process chamber profile at that height and the chamber temperature profile is thus stabilized. In the preferred embodiment, the unloaded wafer is transferred to the cooling chamber 130 to be cooled completely and then is transferred for a subsequent process.

If the semiconductor device is manufactured using the apparatus of the present invention according to the method of the present invention just described, process uniformity can be achieved. This is because the wafer supporter 220 set at the standby position 252 equilibrates to a standby temperature that is almost the same as the process temperature found at the process position 254 prior to processing. Then, by descending to the wafer load/unload position 250 immediately before the wafer is loaded, and rising to the process position 254 right after the wafer is loaded and before the wafer supporter 220 substantially changes temperature, the wafer supporter 220 is already close to the process temperature when it arrives at the process position 254. Therefore, the temperature of the wafer supporter 220 reaches the process temperature in a short time.

Thus, the problem of non-uniform processing in the conventional system caused by the constantly varying temperatures of the wafer supporter 220 even during the process, does not occur in the present invention. For example, typically the wafer loading/unloading position is at a temperature which is about 70° C. lower than at the process temperature, while the standby position is at a temperature only about 20° C. lower. Therefore the temperature variations during the process are much smaller with the apparatus and method of the current invention just described, and the process proceeds more uniformly.

Referring to FIG. 2, the method for optimally forming an HSG-polysilicon layer according to the present invention will be described next.

Immediately before the wafer to be subjected to formation of the HSG-polysilicon layer is loaded, the wafer supporter 220 at the standby position 252 with a predetermined standby temperature descends to the wafer loading/unloading position 250. The wafer has an amorphous silicon layer disposed on its surface in a predetermined pattern. The wafer is loaded on the wafer supporter 220, and then the wafer supporter 220 is elevated to the process position 254 by the elevator. The temperature of the wafer supporter 220 at the process position 254 is heated to a predetermined process temperature in the range from 500° C. to 650° C. Next, silicon source gas, such as disilane gas, is supplied at a flow rate of 7 standard cubic centimeters per minute (sccm) to 23 sccm for 50 seconds to 150 seconds into the processing chamber 120 from the gas supplier 280 through the gas supply tube 282 to provide crystal silicon nuclei on the amorphous silicon layer pattern. Subsequently, the resultant structure having the crystal silicon nuclei on the amorphous silicon layer is annealed for an anneal duration in the range from 100 seconds to 400 seconds to convert the amorphous silicon layer pattern into a polysilicon layer pattern having HSG grains.

The reason for setting the predetermined process temperature of the wafer supporter 220 at the process position 254, within the range from 500° C. to 650° C. is as follows. To form a uniform HSG-polysilicon layer, the crystal growing step must be stable in which amorphous silicon accretes on the crystal silicon nuclei to form the polysilicon layer having HSG grains. Therefore, the temperature of the wafer and the supply of nuclei must be nearly constant. Also, the surface migration speed of silicon, for growing the HSG grains, must be higher than the crystallization speed of amorphous silicon. At a temperature below 500° C., the amorphous silicon does not migrate smoothly and the crystal cannot grow properly. At a temperature over 650° C., the crystallization speed of amorphous silicon is higher than the surface migration speed of silicon so the amorphous silicon mostly forms crystallized silicon that appears as bald spots, or bald defects, rather than HSG grains. Thus, the process of forming the HSG grains must be performed at a constant predetermined process temperature in the range from about 500° C. to about 650° C.

The reason for supplying the silicon source gas at a flow rate in the range from 7 to 23 sccm is as follows. If the silicon source gas is supplied much below 7 sccm, the HSG grains do not grow sufficiently. If the silicon source gas is supplied much above 23 sccm, HSG grains are unnecessarily grown on an insulating layer such as a silicon oxide layer. Thus, the process of forming the HSG grains is best performed at a flow rate in the range from about 7 to about 23 sccm.

The silicon source gas is supplied for 50 to 150 seconds to create nuclei for the following reason. If the silicon source gas is supplied for less than 50 seconds, not enough nuclei suitable for forming the HSG grains are created. If the silicon source gas is supplied for longer than 150 seconds, the nuclei are created on an insulating layer such as a silicon oxide layer, thereby forming an undesired and extraneous HSG-polysilicon layer. Thus, the process of forming the HSG grains is best performed when silicon source gas is supplied for a supply duration in the range from about 50 seconds to about 150 seconds.

The resultant structure having the crystal silicon nuclei is annealed for 100 to 400 seconds for the following reason. If the annealing is performed for less than 100 seconds, the HSG grains are too small to increase the surface area and affect capacitance of a capacitor using the layer as a lower electrode. If the thermal treatment is performed for longer than 400 seconds, the productivity is lowered as the thermal treatment time increases. In view of both the productivity and the quality of the HSG-polysilicon layer, an anneal duration time in the range from about 100 seconds to about 400 seconds is preferable.

To form the HSG-polysilicon layer having superior characteristics as a lower electrode for a capacitor, it is preferable to use the semiconductor device manufacturing apparatus according to the present invention, shown in FIGS. 1 and 2, under the processing conditions as described above. However, it is also possible to form the HSG-polysilicon layer using the conventional semiconductor device manufacturing apparatus, by only conforming the processing conditions including the process temperature, flow rate of the silicon source gas, supply duration of the silicon source gas for creating the crystal nuclei, and anneal duration to those of the present invention. With the conventional apparatus more time is required to achieve the process temperature; thus the productivity is lower with the conventional apparatus. The HSG-polysilicon layer according to the present invention may be used as a lower electrode of a capacitor. To fabricate capacitor cells, first an HSG-polysilicon layer in a cell pattern is formed in the same manner as described above on the wafer. Then, a dielectric film and an upper electrode film are sequentially deposited and patterned in units of cells, thereby forming capacitor cell units. In the HSG-polysilicon layer according to the present invention, the HSG grains have a maximum effective size so the capacitance of all the capacitors are efficiently increased. In the HSG-polysilicon layer according to the present invention, the HSG grains have a constant size because they are formed uniformly throughout the entire surface of the HSG-polysilicon layer, and the capacitance of all the capacitors are substantially the same.

The optimal conditions of the present invention using the preferred embodiment will be described in detail through the following experiments, but the invention is not limited to the particular experimental conditions. The experiments 1 through 3 are related to setting the appropriate positions of the wafer supporter in the semiconductor device manufacturing apparatus according to the present invention, and the experiments 4 through 7 are related to setting appropriate processing conditions for the other parameters of the method.

Experiment 1, described with reference to FIG. 3, was performed to find the effect of the vertical temperature gradient in the processing chamber on formation of the polysilicon layer. This will affect whether the instability of temperature due to the temperature difference between the load/unload position and the process position can be reduced by decreasing the distance between the load/unload and process positions, i.e. by decreasing the value of distance A in FIG. 2. This choice depends on whether the height of the process position affects the quality of the resulting polysilicon layer in terms of thickness and uniformity of thickness.

With other processing conditions for forming the polysilicon layer being the same as that of a conventional fabrication method, the process position of the wafer supporter was set at heights of 76.2 mm, 88.9 mm, 101.6 mm and 114.3 mm distant from the bottom of the processing chamber by installing the wafer supporter at those positions. Then polysilicon layers were formed on wafers loaded on the wafer supporters at each of those heights, respectively. The thickness and uniformity of each formed polysilicon layer was entered in Table 1 and graphed in FIG. 3 in which the position of the wafer supporter indicates the distance from the bottom of the processing chamber to the wafer supporter. Thickness is measured in Angstroms Å and uniformity in percent variations in thickness. The smaller the variation percentage, the better the uniformity.

TABLE 1

| Type | Position of wafer supporter (mm) | Thickness of polysilicon layer (Å) | Uniformity (%) |
|---|---|---|---|
| 1 | 76.2 | 170.3 | 19.67 |
| 2 | 88.9 | 213.7 | 10.53 |
| 3 | 101.6 | 291.9 | 6.00 |
| 4 | 114.3 | 348.7 | 5.02 |

Figure 3:
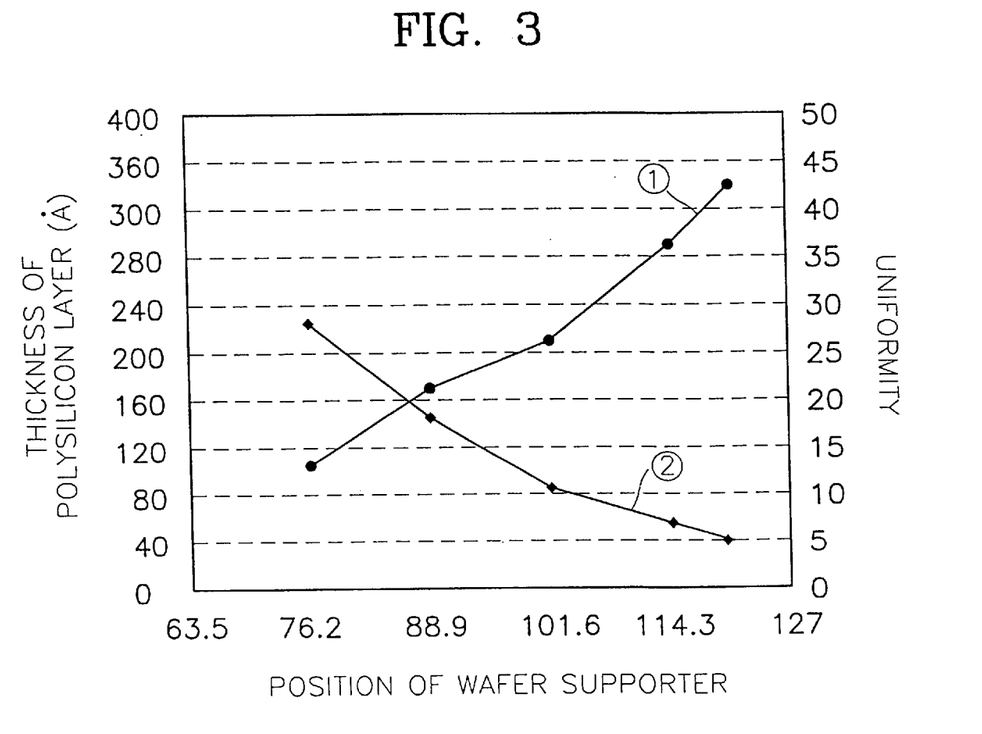
FIG. 3 is a graph showing the relationship between standby positions for a wafer supporter, and both the thickness of a polysilicon layer and the variance indicative of the uniformity of the layer.

As shown in Table 1 and FIG. 3, the higher the wafer supporter is positioned, the thicker the polysilicon layer and the better the uniformity thereof. Thus, any attempt at reducing the temperature difference by lowering the process position and reducing the distance between the wafer load/unload position and the process position, may cause other problems.

Figure 4:
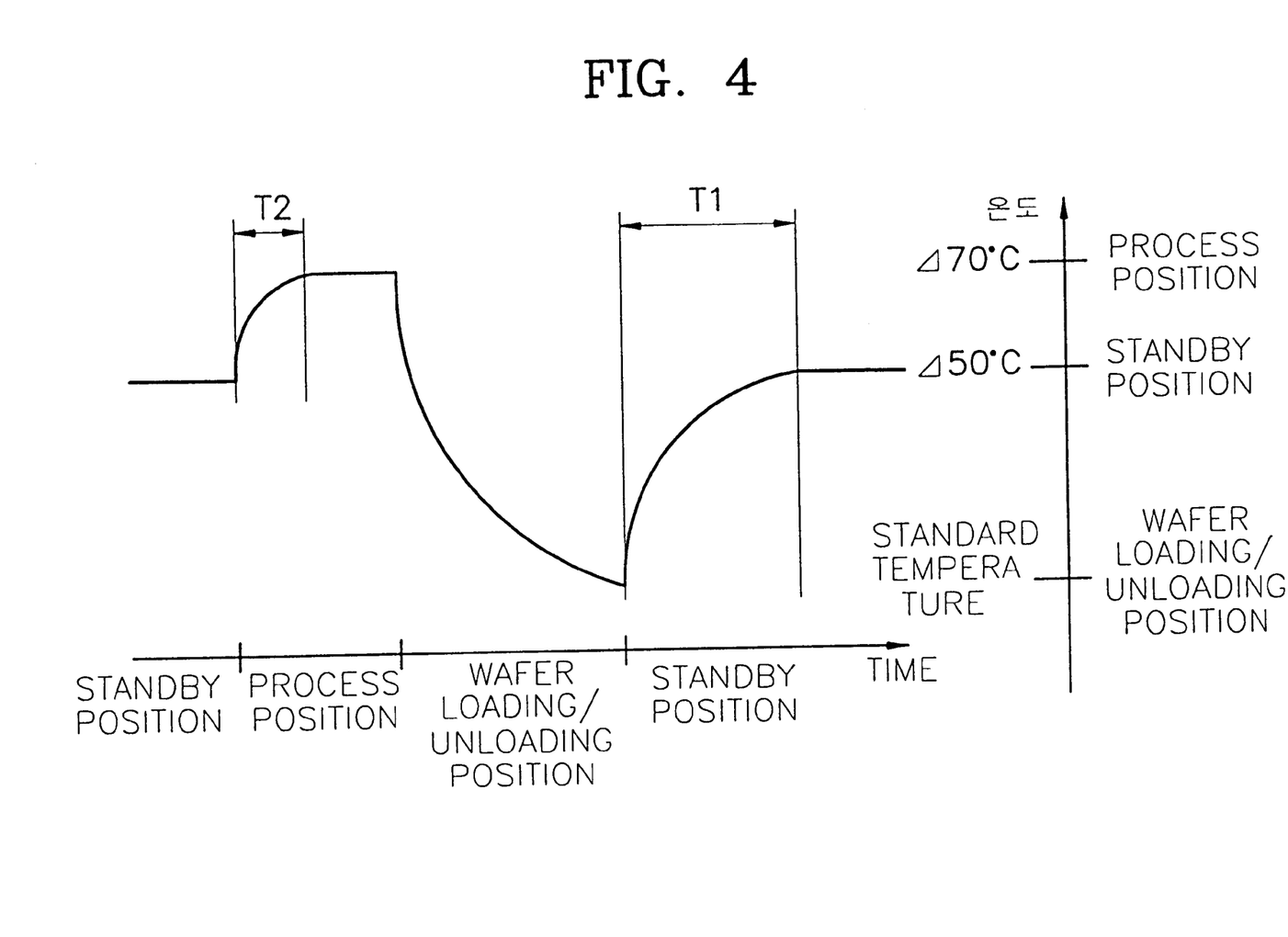
FIG. 4 is a graph showing the temperature of a wafer supporter varying depending on the changes in position of the wafer supporter with time.

Experiment 2, described with reference to FIG. 4, was performed to determine the effect of setting the standby position between the process position and the wafer load/unload position, without lowering the process position. The effect is determined by measuring the change in temperatures of the chamber with time as the wafer supporter is moved vertically among the three positions. The measurement was done in a state where the standby ratio of the distance A to the distance B (see FIG. 2) was set to 0.70:1. The curve plotting the temperature change is shown in FIG. 4. In FIG. 4 the standard temperature is the temperature at the load/unload position and thus the ambient temperature, for example, in the transfer chamber (112 in FIG. 1). The standby temperature of the standby position is 50° C. higher than the standard temperature, and the temperature of the process position is 70 ° C. higher than the standard temperature.

As shown in FIG. 4, when the wafer is moved from the wafer load/unload position to the standby position where the temperature is designed to be 50° C. higher, the time T1 necessary for stabilizing the chamber temperature to the standby temperature was about two (2) hours. On the other hand, when the wafer supporter moved from the standby position to the process position where the temperature is designed to be about 20° C. higher, the time T2 necessary for stabilizing the chamber temperature to the process temperature was shorter than the time T1 necessary for stabilizing the chamber temperature to the standby temperature.

Therefore, before the process is performed, the wafer supporter is placed at the standby position to stabilize the chamber temperature at the higher standby position temperature, which is closer to the process position temperature. Then, the wafer supporter is lowered to the wafer load/unload position immediately before loading. After the wafer is loaded, and the wafer supporter is elevated to the process position before the chamber temperature decreases substantially. Therefore, the chamber temperature need only increase about 20° C. to achieve the process temperature, not 70° C.

Experiment 3, described with reference to FIG. 5, was performed to find the standby ratio that keeps the chamber temperature most uniform and stable. To determine the appropriate height of the standby position, the standby ratio was varied among 0.63:1, 0.73:1 and 0.80:1. The temperature of the chamber and the temperature of a chamber insulating jacket were continuously measured while the process was performed. The result is shown in FIG. 5A through FIG. 5C, in which the curve $\hat{1}$ indicates the change in chamber temperatures and the curve $\hat{2}$ indicates the change in jacket temperatures.

Figure 5A:
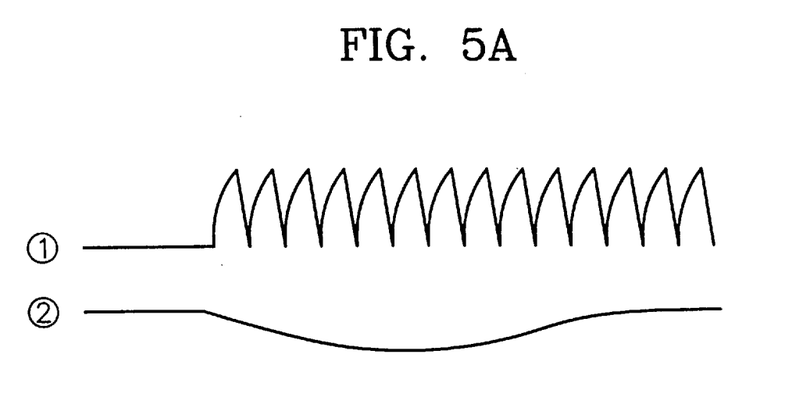
FIGS. 5A through 5C are graphs showing the temporal changes in the temperature of a processing chamber and a jacket surrounding the chamber depending on the increasing ratio of the distance from the wafer load/unload position to a standby position with respect to the distance from the wafer load/unload position to a process position.
Figure 5B:
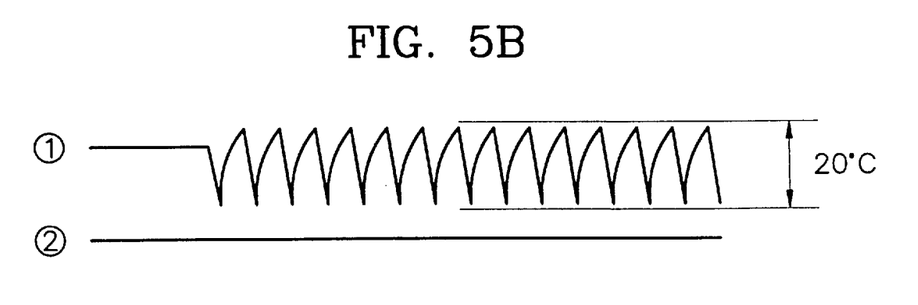
Figure 5C:
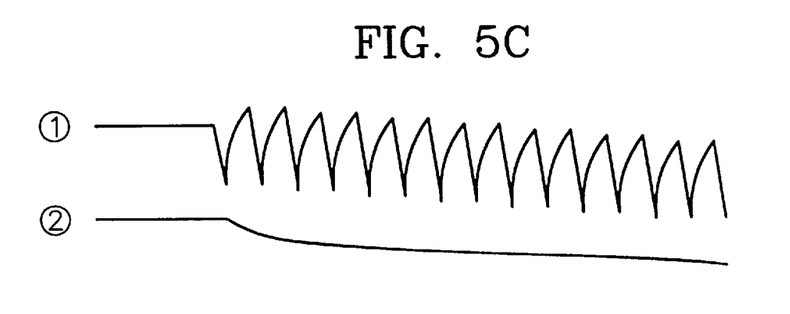

As shown in FIG. 5A, when the standby ratio, A:B, is 0.63:1, the jacket temperature decreased at first and then increased, and finally stabilized. As shown in FIG. 5C, when the standby ratio, A:B, is 0.80:1, after the process was performed on a plurality of wafers, the temperature was stabilized. As shown in FIG. 5B, when the standby ratio, A:B, is 0.73:1, the chamber temperature was stabilized within a range of 20° C. Therefore, it is preferable that the standby ratio, i.e. the ratio of the distance A to the distance B, be greater than 0.63:1 and less than 0.8:1. That is, it is preferable that 0.63:1<A:B<0.8:1.

Experiment 4, described with reference to FIG. 6 and FIG. 7, was performed to determine the temperature of the wafer supporter which is the most appropriate for forming the HSG-polysilicon layer having superior characteristics for a lower electrode of a capacitor. In this experiment, the temperature of the wafer supporter is about 130° C. to about 150° C. less than the temperature of the heaters (212, 214 in FIG. 2) in the heating block (210 in FIG. 2). While varying the heater temperature within the range of about 767° C. to 780° C., the number of bald defects generated in the respective temperatures and the grade of the HSG grains were measured. Bald defects occur where amorphous silicon crystallizes instead of forming HSG grains. Grade is an arbitrary number indicating relative number of HSG grains per unit area, i.e. indicating grain density. The grade varies from zero (0) indicating no HSG grains observed to ten (10) indicating the surface is covered with HSG grains, i.e. that the grains are connected to each other. Generally, DRAMs beyond 16-megabit capacity require grade levels of 7 or above.

Figure 6:
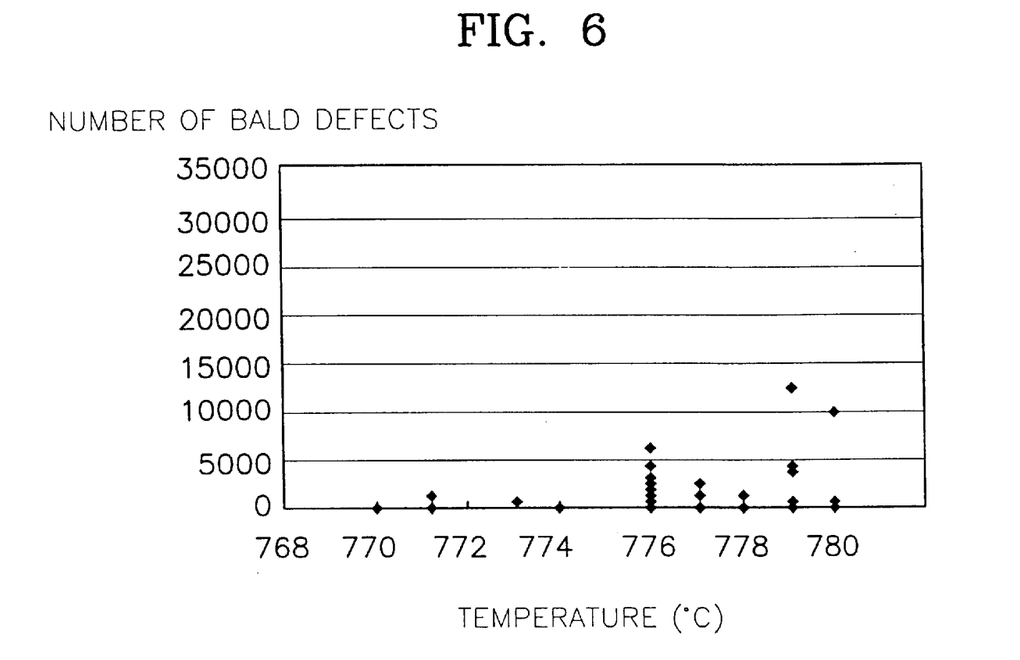
FIG. 6 is a graph showing the relationship between the temperature of a processing chamber heater and the number of bald defects formed in the HSG-polysilicon layer.
Figure 7:
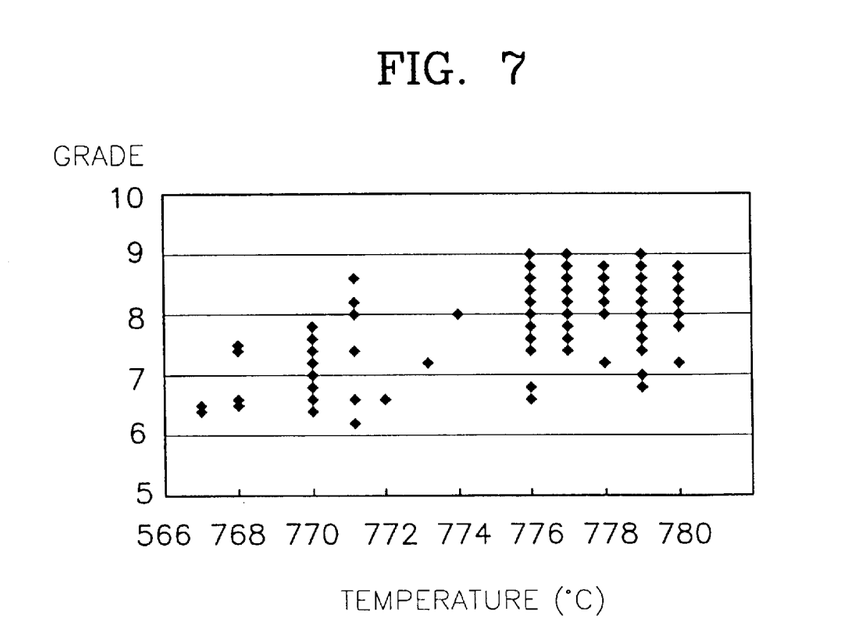
FIG. 7 is a graph showing the relationship between the temperature of a processing chamber heater and the grade of the HSG-polysilicon layer.

The relationship between the heater temperature and the number of bald defects is shown in FIG. 6, and the relationship between the heater temperature and the grade is shown in FIG. 7.

FIG. 6 indicates that the number of bald defects increases as the heater temperature increases. The reason for the foregoing is that at higher temperatures the crystallization speed of amorphous silicon becomes greater than the surface migration speed of silicon for growth of crystal grains. Thus, at higher temperatures more crystallization occurs and more bald defects are created. FIG. 7 shows that the HSG density, indicated by the grade, also increases as the temperature increases.

From FIG. 6 it can be seen that the HSG-polysilicon layer is preferably formed at a heater temperature of 780° C. or less, namely a wafer supporter temperature of 650° C. or less, in order to ensure that bald defect levels stay predominantly below 5000. FIG. 7 shows that the more the heater temperature increases, the more grade 7 HSG-polysilicon layers are assured, which are suitable for DRAMs beyond 16-megabit capacity. However, considering the results of FIG. 6, which indicate that higher temperatures result in larger bald defect levels, the upper limit of the heater temperature is preferably maintained at 780° C. or less, i.e., a wafer supporter temperature of 650° C. or less. Also, considering that at heater temperatures below 650° C., i.e., wafer supporter temperatures below about 500° C., the amorphous silicon does not migrate smoothly and the crystals cannot grow properly, the optimal wafer supporter temperatures range from about 500° C. to about 650° C. Thus, when the wafer supporter temperature is in the range of about 500° C. to about 650° C., a good density (grade 7) HSG-polysilicon layer can be formed without bald defects.

Figure 8:
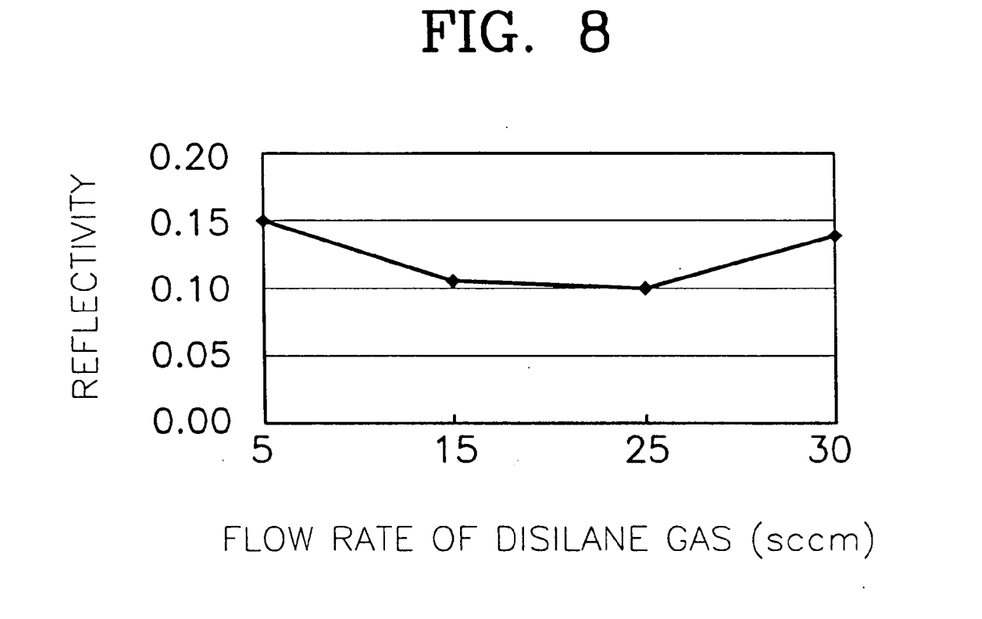
FIG. 8 is a graph showing the relationship between the flow rate of disilane gas for forming crystal nuclei and the reflectivity of the HSG-polysilicon layer.

Experiment 5, described with reference to FIG. 8, was performed to verify how fast a silicon source gas, e.g., a disilane gas, must be supplied to provide an adequate number of crystal silicon nuclei on an amorphous silicon layer. The disilane gas was supplied over the wafer at flow rates of 5, 10, 15, 25 and 30 sccm, and then annealed, thereby forming the HSG-polysilicon layer. The reflectivity of the HSG-polysilicon layer at ultraviolet wavelengths is inversely proportional to size of the HSG grains, so the reflectivities were measured by a reflectivity measuring method using ultraviolet rays. The measurement results are entered in FIG. 8 and Table 2.

TABLE 2

| Type | Flow rate of disilane gas (sccm) | Reflectivity |
| --- | --- | --- |
| 1 | 5 | 0.150 |
| 2 | 10 | 0.125 |
| 3 | 15 | 0.105 |

TABLE 2-continued

| Type | Flow rate of disilane gas (sccm) | Reflectivity |
| --- | --- | --- |
| 4 | 25 | 0.100 |
| 5 | 30 | 0.140 |

The reflectivity of the amorphous silicon layer without HSG grains is 0.43. When the reflectivity of the HSG-polysilicon layer is 0.2, the capacitance of a capacitor formed with that layer as the lower electrode is 1.5 times that of the capacitor formed with the conventional polysilicon layer. When the reflectivity of the HSG-polysilicon layer is 0.1, the capacitance of a capacitor is 1.8 times that of the capacitor formed with the conventional polysilicon layer. It is therefore evident from this experiment that the disilane gas for forming crystal nuclei of the HSG-polysilicon layer can be supplied at a flow rate in the range from about 5 sccm to about 25 sccm. Further information indicates that if the disilane gas is supplied at flow rates at 5 sccm or below, the amorphous silicon layer is not formed properly; and if the disilane gas is supplied at flow rates at 25 sccm or above, the crystal nuclei are formed not only on the amorphous silicon layer but also on the silicon oxide layer, which decreases selectivity. Therefore, the disilane gas is more preferably supplied at a flow rate in the range from about 7 sccm to about 23 scem.

experiment 6, described with reference to FIG. 9, was performed to set the optimal supply duration suitable for forming crystal silicon nuclei. In this experiment, the disilane gas was supplied at 15 sccm, with different supply durations of 50, 70, 90 and 120 seconds. Then the HSG-polysilicon layer was formed and reflectivity measured using ultraviolet rays. The measured results are entered in Table 3 and FIG. 9.

TABLE 3

| Type | Flow time of disilane gas (second) | Reflectivity |
| --- | --- | --- |
| 1 | 50 | 0.28 |
| 2 | 70 | 0.14 |
| 3 | 90 | 0.10 |
| 4 | 120 | 0.11 |

Figure 9:
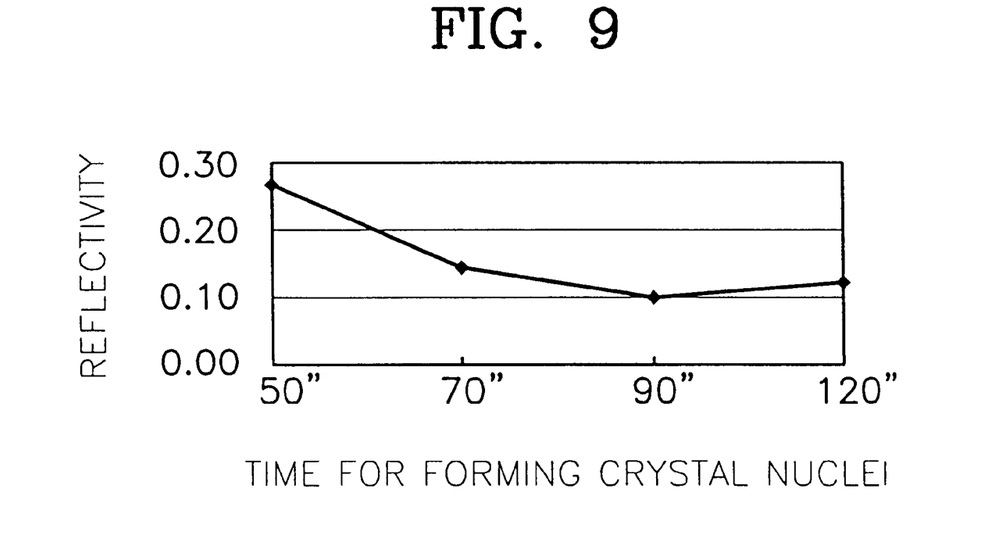
FIG. 9 is a graph showing the relationship between the duration for forming crystal nuclei and the reflectivity of the HSG-polysilicon layer.

Table 3 and FIG. 9 show that the supply durations for the disilane gas is preferably 60 seconds to about 120 seconds, because a supply duration of 50 seconds gives the worst results and the other tested durations give good results very similar to each other.

experiment 7 was performed to determine the appropriate annealing duration for forming HSG grains. During the annealing process, amorphous silicon molecules accrete onto the crystal silicon nuclei. In this experiment the crystal silicon nuclei were formed with the disilane gas supplied at 15 sccm for 90 seconds. Annealing durations were tested at 80, 100, 150, 200, 220, 240, 260, 280, 300, 350, 400 and 450 seconds. It was found that the reflectivity increases as the annealing duration increases over all these values. Sufficient reflectivity to indicate capacitances suitable for DRAMS beyond 16-megabit was achieved after about 100 seconds. Productivity was substantially impaired when annealing durations exceeded 400 seconds. Therefore, it is preferred to perform annealing for an annealing duration within the range from about 100 seconds to about 450 seconds.

By using the method and apparatus of the present invention, processing uniformity is enhanced in a processing chamber. By applying the apparatus of the present invention according to the preferred embodiment of a method to form an HSG-polysilicon layer, in which processing conditions are optimally set, a HSG-polysilicon layer can be formed with improved characteristics suitable for the lower electrodes of higher capacitance capacitors without defects such as bald defects.

Preferred embodiments of the present invention have been described through drawings and detailed description and specific examples. However, it is to be understood that the invention is certainly not limited to these disclosed embodiments, but, on the contrary, can be varied widely by a person of ordinary skill in the art without departing from the spirit or scope of the invention as defined by the appended claims and their equivalents.

What is claimed is:

1. A method for manufacturing a semiconductor device, comprising:

setting a wafer supporter at a standby position in a processing chamber, and maintaining the wafer supporter at the standby position to equilibrate a temperature of the wafer supporter and a temperature prevailing in the processing chamber at the standby position, without any wafer being loaded on the wafer supporter, wherein the temperature in the processing chamber is stabilized at a standby temperature;

using an elevator to lower the wafer supporter from the standby position to a wafer load/unload position once the temperature in the processing chamber has stabilized;

loading a wafer onto the wafer supporter once the wafer supporter is at the load/unload position;

subsequently using the elevator to elevate the wafer supporter with the wafer loaded thereon from the load/unload position to a process position located above the standby position in the processing chamber;

performing a process for manufacturing a semiconductor device while the wafer supporter is at the process position with the wafer loaded thereon;

using the elevator to re-lower the wafer supporter with the wafer loaded thereon to the wafer load/unload position after completing the manufacturing process;

unloading the processed wafer from the wafer supporter; and subsequently using the elevator to re-elevate the wafer supporter to the wafer standby position without any wafer being loaded thereon.

2. The method of claim 1, wherein during said lowering, elevating, re-lowering and re-elevating, a standby distance separates the wafer load/unload position from the standby position, a process distance separates the wafer load/unload position from the process position, and a standby ratio of the standby distance to the process distance is in a ratio range from about 0.63:1 to about 0.8:1.

3. The method of claim 1, wherein, said performing a process, comprises forming a hemispherical grain polysilicon (HSG-polysilicon) layer on the wafer.

4. The method of claim 3, wherein said performing a process comprises heating the wafer supporter to a predetermined process temperature in a range from about 500° C. to about 650° C.

5. The method of claim 3, wherein said performing a process comprises:

supplying a silicon source gas into the processing chamber to provide crystal silicon nuclei on an amorphous silicon layer on the wafer; and annealing the amorphous silicon layer with the crystal silicon nuclei to convert the amorphous silicon layer into an HSG-polysilicon layer.

6. The method of claim 5, wherein, said supplying comprises supplying the silicon source gas with a flow rate within a flow rate range from about 7 standard cubic centimeters per minute (sccm) to about 23 sccm.

7. The method of claim 5, wherein said supplying proceeds for a supply duration within a supply duration range from about 50 seconds to about 150 seconds.

8. The method of claim 5, wherein said annealing proceeds for an anneal duration within an anneal duration range from about 100 seconds to about 400 seconds.

9. The method of claim 1, wherein said loading, said elevating, said performing a process, said re-lowering and said unloading are repeatedly executed in sequence on a plurality of wafers until a last of said plurality of wafers has been subjected to said unloading, after which said re-elevating is executed.

* * * * *